United States Patent [19]
Swart et al.

[11] Patent Number: 5,641,315
[45] Date of Patent: Jun. 24, 1997

[54] TELESCOPING SPRING PROBE

[75] Inventors: Mark A. Swart, Anaheim Hills; Gordon Vinther, Los Angeles, both of Calif.

[73] Assignee: Everett Charles Technologies, Inc., Pomona, Calif.

[21] Appl. No.: 558,687

[22] Filed: Nov. 16, 1995

[51] Int. Cl.$^6$ .................................................. H01R 13/24
[52] U.S. Cl. ...................... 439/824; 439/700; 324/761; 324/72.5
[58] Field of Search .................................. 439/700, 824, 439/265, 267, 268, 840, 841, 482; 324/761, 754, 72.5

[56] References Cited

U.S. PATENT DOCUMENTS

| | | | |
|---|---|---|---|
| 4,591,222 | 5/1986 | Shaffer | 439/700 |
| 5,151,040 | 9/1992 | Tanaka | 439/700 |
| 5,328,391 | 7/1994 | Soshi et al. | 439/700 |
| 5,509,813 | 4/1996 | Lu | 439/700 |

*Primary Examiner*—Neil Abrams
*Assistant Examiner*—Brian J. Biggi
*Attorney, Agent, or Firm*—Christie, Parker & Hale, LLP

[57] ABSTRACT

Telescoping spring probes include a barrel having a hollow cylindrical body with a passageway extending from a closed barrel end to an open barrel end. The open barrel end is crimped radially inward into the passageway. A plunger axially disposed within the barrel passageway comprises a hollow body having an internal cavity extending from an open plunger end to a closed plunger end. The open plunger end disposed within the barrel passageway faces the closed barrel end. The plunger body has an outside surface portion with a diameter greater than the crimped barrel open end to prevent the plunger from exiting the barrel. A spring is disposed axially within the barrel passageway and the plunger cavity. In a first embodiment, the plunger body includes an inwardly deflected detent contacting one end of the spring to imposes a spring force which biases the plunger body against the barrel passageway. In third and fourth embodiments, the closed plunger end has an angled or beveled profile that contacts one end of the spring to impose a force onto the spring biasing the plunger body against the barrel passageway. This biased spring action produces continuous mechanical contact and resulting continuous electrical conductivity between the plunger and barrel during axial travel of the plunger in the barrel.

19 Claims, 3 Drawing Sheets

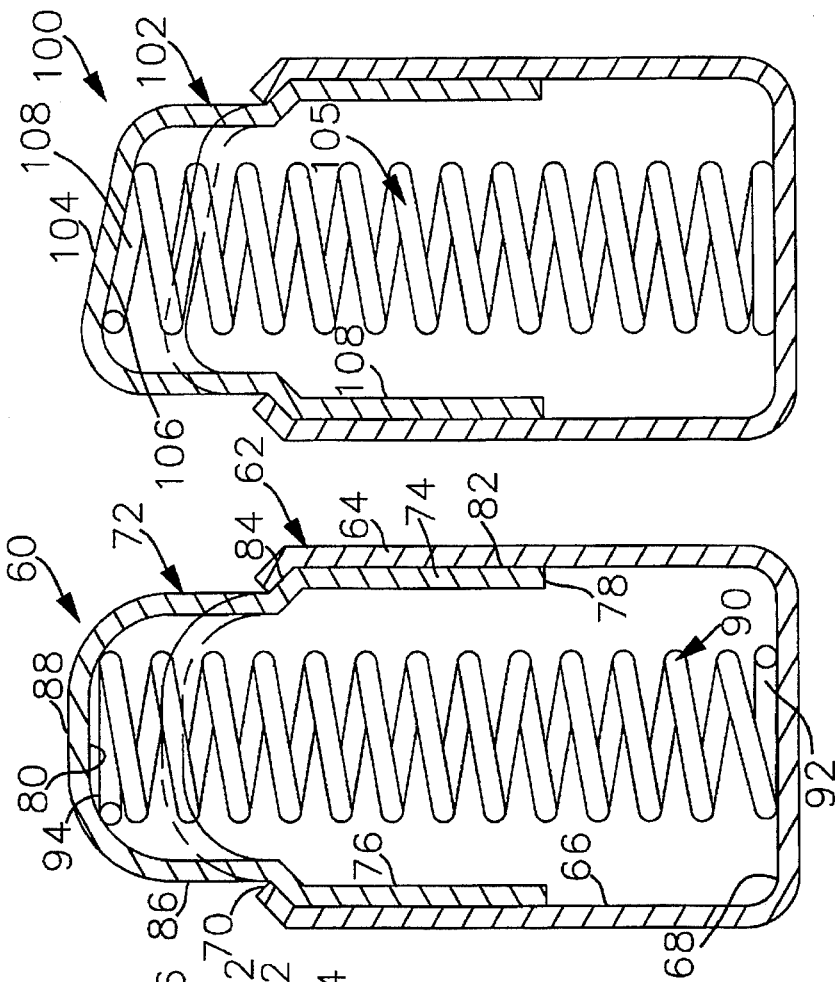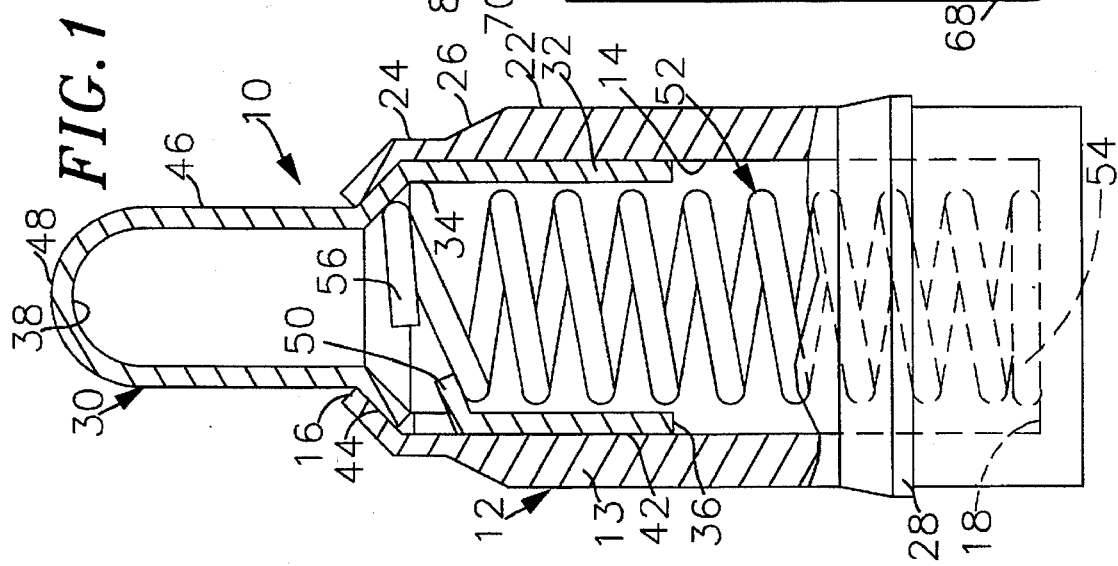

TELESCOPING SPRING PROBE

FIELD OF THE INVENTION

This invention relates to electrical contact probes and, more particularly, to telescoping spring-loaded contact probes having enhanced bearing and electrically compliant surfaces, and having an overall reduced probe length when compared to conventional spring-loaded probes.

BACKGROUND OF THE INVENTION

Conventional spring-loaded electrical contact probes generally include an outer structure or barrel, a movable plunger slidably disposed within the barrel, and a spring within the barrel for biasing the reciprocating travel of the plunger within the barrel. A portion of the plunger is commonly biased outwardly away from the barrel a selected distance by the spring, and may be biased or depressed into the barrel, a selected distance, under force directed against the spring.

The spring and plunger are arranged in such conventional spring probes with the spring disposed within the barrel between a closed end of the barrel and an enclosed end of the plunger. Constructed in this manner, the barrel is sized having a length adapted to accommodate therein both the entire length of the spring and a portion of the plunger. The plunger is disposed within the barrel a sufficient length to provide a desired degree of tip alignment and stability, to minimize tip wobble and thereby ensure that a tip portion of the plunger that extends from the barrel is capable of making contact with the target electrical contact. Accordingly, the overall length of the barrel and plunger assembly making up the probe has been relative long to accommodate both the spring and a portion of the plungers sufficient to minimize plunger wobble.

When used in portable-type applications, including battery-powered articles, such as a portable computer, cellular phone and the like, the probe serves to make electrical contact with terminals or contacts of a removable electrical power source, such as a battery. The barrel portion of the probe is fixedly mounted within the battery-powered article so that contact between the probe plunger and the electrical contacts of the battery causes the plunger to be displaced within the barrel.

Electricity transmitted from the electrical source, e.g., battery, through such a conventionally configured probe to the battery powered article is conducted primarily through the spring. This is due to the relatively sporadic contact made between the side walls of the plunger and the surrounding inside wall of the barrel, and the resulting sporadic electrical continuity between them. Conventional probes are designed to facilitate free axial displacement of the plunger within the barrel. Accordingly, as the plunger is displaced in and out within the barrel, or moved laterally when loaded in a fixed axial position in the barrel, the adjacent plunger and barrel walls move in and out of contact with one another. This creates sporadic open circuits through the probe and causes the electrical current to be transmitted by the probe through the spring.

The wire diameter of springs used in conventional spring probes varies between approximately 0.1 to 0.3 millimeters and therefore limits the amount of current conducted through the spring. This effectively limits the application of such spring probes to low electrical current transfer applications. For example, such conventional spring probes are commonly used in applications where less than about 5 amperes of current are conducted, making such spring probes impractical for use in such high-current applications as portable computers and the like.

It is generally desired that the size of such battery powered portable devices be as small as possible to enhance portability. The trend has, therefore, also been to reduce both the size of the battery packs that power such devices and the related size of the batter pack ports in the battery-powered articles. In view of such size reductions, electrical springprobes used to facilitate electrical connection between such battery-powered articles and battery packs used to power them also must be reduced.

It is, therefore, desired that a spring probe be constructed having a compact barrel and plunger design that will facilitate use in applications where reduced probe length and plunger travel are needed. It is desired that the spring probe be designed so that, while having reduced overall probe length, it maintains a desired degree of tip alignment, thereby minimizing plunger wobble. It is also desired that the probe be constructed with a sufficient degree of electrical contact between the barrel and plunger to provide a desired degree of electrical continuity to facilitate use in relatively high-current transfer applications.

SUMMARY OF THE INVENTION

Telescoping electrical contact spring probes constructed according to principles of this invention have a compact barrel and plunger design that facilitates use in applications where reduced probe length and plunger travel are desired. The probes have a sufficient amount of plunger sidewall to barrel wall contact to provide both continuous electrical continuity therebetween and a useful degree of tip point alignment.

Telescoping spring probes of this invention include a barrel in the form of a hollow cylindrical body. A passageway extends through the barrel body from a closed barrel end to an open barrel end. The open barrel end is crimped radially inward a selected distance into the passageway. A plunger in the form of a hollow body is axially disposed within the barrel passageway. An internal chamber extends through the plunger body from an open plunger end to a closed plunger end. The open plunger end is oriented within the barrel passageway facing the closed barrel end. The plunger body has an outside surface portion with a diameter greater than the crimped barrel open end to prevent the plunger from exiting the barrel. A spring is disposed axially within the barrel passageway and the plunger chamber.

The probe can include means disposed within the plunger chamber for imposing a sufficient force onto the spring to bias a sidewall portion of the plunger body against the barrel passageway. In one embodiment, the means for imposing a force onto the spring is in the form of a inwardly deflected sidewall portion or detent of the plunger body. The detent is deflected inwardly into the chamber to make contact with one end of the spring. Contact between the detent and the spring end imposes a force onto the spring that causes the plunger body to be biased against the barrel passageway.

In further embodiments, the means for imposing a force onto the spring is in the form of an angled or beveled closed plunger end. Contact by a spring end against an inside surface of the angled closed plunger end imposes a force onto the spring that causes the plunger body to be biased against the barrel passageway.

This spring biasing action produces continuous mechanical contact and a resulting continuous electrical conductivity between the plunger and barrel during axial travel of the plunger in the barrel. This facilitates use of the contact in high-current applications. In addition, plunger travel is stable and pointing accuracy is good. The plunger design also facilitates constructing the contact with a minimum overall probe length.

BRIEF DESCRIPTION OF THE DRAWINGS

These and other features and advantages of the present invention will become appreciated as the same become better understood with reference to the specification, claims and drawings wherein:

FIG. 1 is a cross-sectional side view of a first embodiment of a telescoping spring probe as constructed according to principles of this invention;

FIG. 3 is a cross-sectional side view of a second embodiment of a telescoping spring probe as constructed according to principles of this invention;

FIG. 4 is a cross-sectional side view of a third embodiment of a telescoping spring probe as constructed according to principles of this invention;

DETAILED DESCRIPTION OF THE INVENTION

Figure 2:
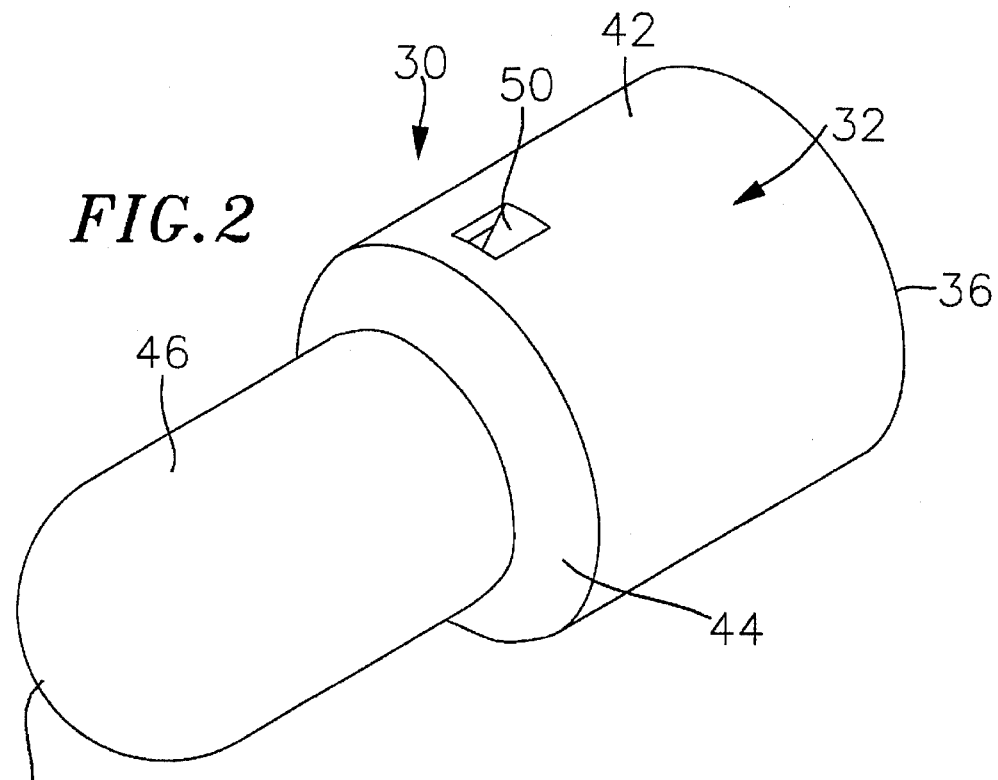
FIG. 2 is a perspective view of a plunger from the telescoping spring probe of FIG. 1.

FIG. 1 illustrates a first embodiment of a telescoping spring probe constructed according to principles of this invention. Telescoping spring probes of this invention can be used in applications where electrical contact and the transfer of relatively high current loads must be made under conditions of limited space. Applications for probes of this invention include, but are not limited to, portable battery-powered electrical objects such as portable computers, cellular phones and the like that each require electrical connection with a removable battery source or pack.

A first embodiment of the telescoping spring probe 10 includes an elongated generally cylindrical barrel 12 having a generally circular tubular body 13 forming a hollow passageway 14 extending from an open end 16 of the barrel to a closed end 18 of the barrel. The passageway 14 has a uniform diameter therethrough. An outside surface of the barrel body has an enlarged diameter section 22 extending from the closed end 18 a majority of the length of the barrel body toward the open end 16. The outside surface of the barrel body also includes a reduced diameter section 24 adjacent the open end 16, and an angled transition section 26 between the enlarged and reduced diameter sections 22 and 24, respectively.

The wall portion of the barrel body corresponding to the enlarged diameter section 22 has a thickness greater than a wall portion of the barrel corresponding to the reduced diameter section 24. The relatively thicker wall portion of the enlarged diameter section compared to the wall portion of the reduced diameter section 24, facilitates conducting high current loads through the barrel wall. The relatively thinner wall portion of the reduced diameter section facilitates crimping a terminal portion of the open end 16 radially inward to contain a plunger within the barrel passageway 14.

In an example of the first embodiment, the enlarged diameter section 22 has a length of approximately 3.3 millimeters (mm) and has an outside diameter of approximately 2 mm. The transition section 26 has an axial length of approximately 0.18 mm and is directed radially inward away from the surface of the enlarged diameter section 22 at an angle of approximately 30 degrees. The reduced diameter section 24 has an axial length of approximately 6.3 mm and has an outside diameter of approximately 16.5 mm. The barrel wall thickness at the enlarged diameter section is approximately 0.3 mm, and the barrel wall thickness at the reduced diameter section is approximately 0.13 mm.

While a specific embodiment of the barrel has been described and illustrated, it is to be understood that the outside surface of the barrel body can additionally be configured having one or more of a number of differently shaped attachment surfaces to facilitate attachment of the barrel within a particular article, such as within a plated hole of a printed circuit board, a plastic connecter having terminals soldered to the barrel, and the like. For example, in FIG. 1 the first embodiment is illustrated having a press ring 28 disposed circumferentially around a portion of the barrel body outside surface near the barrel's closed end 18. The press ring 28 is used to facilitate seating the barrel in an electrically conductive opening of an electrical contact assembly or the like.

The telescoping probe of FIG. 1 also includes a plunger 30 having an elongated generally cylindrical hollow body 32 with an internal cavity 34 extending from an open end 36 of the plunger to a closed end 38 of the plunger. The plunger body 32 has an outside body surface that includes a first diameter section 42 extending axially from the open end 36 a distance toward the closed end 38. Moving from the first diameter section 42 toward the closed end 38 of the plunger, the plunger body includes an angled or cone-shaped transition section 44. The cone-shaped section 44 extends axially along the outside plunger body surface to a second diameter section 46 having an outside diameter smaller than the first diameter section 42.

The second diameter section 46 extends axially along the outside surface of the plunger body to the closed end 38 which defines a tip 48 of the plunger. The tip 48 can have a number of different configurations to facilitate electrical connection with an adjacent electrical contact. For example, the tip can have a single pointed surface or a number of pointed prongs. In FIG. 1, the tip has a rounded surface to facilitate electrical connection by either axial or lateral displacement of the desired electrical contact thereon.

In an example of the first embodiment, the plunger first diameter section 42 has an axial length of approximately 1.5 mm and an outside diameter of approximately 1.3 mm. The cone-shaped section 44 has an axial length of approximately 0.18 mm. The second diameter section 46 has an axial length of approximately 1.5 mm and an outside diameter of approximately 0.9 mm.

The plunger cavity 34 has a uniform diameter that extending axially from the open end 36 to the cone-shaped section 44. In an example of the first embodiment, the cone-shaped section 44 projects radially inwardly from the surface of the first diameter section 42 at an angle of approximately 45 degrees. The portion of the chamber 34 that corresponds with the cone-shaped barrel 44 section also is directly radially inward at the same angle. The plunger body 32 has a generally uniform wall thickness throughout. In the example of the first embodiment, the plunger body wall thickness is approximately 0.1 mm.

Referring to FIGS. 1 and 2, the plunger body 32 includes a detent 50 an inwardly deflected wall portion of the body directed radially inward from the first diameter section 42 a selected distance into the plunger cavity 34. The deflected wall portion forming the detent 50 is cut along a top portion away from the cone-shaped section 44 and along side portions, so that it is bent from a base radially inward into the cavity. In an example of the first embodiment, the detent 50 has a width, measured from side portion to side portion, of approximately 0.4 mm, and is bent radially inward a distance of approximately 0.35 mm from the surface of the first diameter section 42 at an angle of approximately 60 degrees. As described in detail below, the detent imposes a biasing load onto a spring disposed within the plunger to bias the plunger within the barrel passageway 14.

Referring to FIG. 1, the plunger 30 is axially disposed within the barrel passageway 14 with the plunger open end 36 facing the closed end 18 of the barrel, and with the plunger body outside surface adjacent the inside surface of the barrel passageway. The plunger body 32 has an outside diameter slightly smaller than the inside diameter of the barrel passageway to facilitate slidable axial displacement therein. In an example of the first embodiment, the tolerance between the plunger body outside surface and the barrel passageway is approximately 0.02 mm.

An elongated coil spring 52 is disposed axially within the barrel passageway 14 and within the plunger cavity 34. A first spring end 54 is placed adjacent the closed end 18 of the barrel, and a second spring end 56 placed adjacent the detent 50 and adjacent the inside surface of the plunger body cone-shaped section 44. The spring 52 has an outside diameter sized to facilitate non-binding axial displacement of the spring within the plunger chamber 34. Placement of the second spring end 56 against the detent 50 imposes a laterally directed biasing force onto the spring 52 which imposes an equal and opposite biasing force onto the plunger from within the plunger cavity 34. In FIG. 1, the biasing force imposed by spring onto the plunger causes plunger to be biased in a clockwise direction, i.e., towards the right (with reference to FIG. 1) within the barrel. The biasing force is desired because it causes the outside surface of the plunger body to remain in contact with the inside surface of the barrel passageway both during axial displacement of the plunger within the barrel and when the plunger is stationary within the barrel.

The enhanced contact between plunger and barrel produced by the biasing force is desired because it ensures continuous electrical continuity between the plunger and barrel, as a result, electrical current conducted through the probe passes through the contacting plunger and barrel walls rather than through the spring. When compared to conventional spring probe configurations, which are not biased and depend on the spring for transferring current through the probe, telescoping spring probes of this invention are capable of carrying larger amounts of current. Therefore, telescoping probes of this invention are useful in applications where both reduced size and high current carrying capability are required.

The spring 52 not only imposes a biasing force against the plunger, but it also biases the plunger axially outwardly away from the barrel. The spring 52 is an elongated coil spring made from conventional electrically conductive materials such as metal, metal alloy and the like. It is desired that the spring have a length and a spring rate to impose a sufficient biasing force onto the plunger to ensure good electrical contact between adjacent plunger and barrel wall portions, to provide a predetermined level of compression force to the plunger to facilitate axial displacement of the plunger within the barrel, and to impose a sufficient compression force between the probe tip 48 and an adjacent electrical contact.

In an example of the first embodiment, the spring 52 has a wire diameter of approximately 0.12 mm, a noncompressed length of approximately 3.8 mm, and a spring rate of approximately 0.7 Newton/meters. When installed within the probe, the spring is designed to deliver approximately 85 grams of force at approximately 0.07 mm of axial plunger travel.

Complete outward displacement of the plunger 30 from the barrel is prevented by crimping the open end 16 of the barrel radially inward. The open end 16 is crimped radially inward by a distance that corresponds to the angle of the plunger body surface cone-shaped section 44, so that outward biasing of the plunger by the spring 52 causes the crimped barrel open end 16 and the plunger surface cone-shaped section 44 to contact each other and prevent further outward displacement of the plunger. The crimped open end 16 has a opening diameter larger than the plunger body surface second diameter section 46 to facilitate its axial travel therethrough. In an example of the first embodiment, the open end 16 is crimped radially inward an angle of approximately 45 degrees from the reduced diameter section 24 of the barrel body, and has an opening diameter of approximately 0.9 mm.

The plunger 30 is designed to travel axially within the barrel past a maximum inward distance defined by contact of the plunger open end 36 against the closed end 18 of the barrel. In an example of the first embodiment, the desired inward plunger travel within the barrel is approximately 1 mm.

The design of the telescoping probe, having the spring disposed within the hollow plunger chamber 34, allows construction of the probe with a reduced length, compared to conventional spring probes having the spring loaded within the barrel behind a solid probe end. Additionally, the design of the telescoping probe allows the overall probe length to be reduced without adversely affecting the pointing accuracy of the plunger tip, i.e., without causing unwanted probe wobble. This is due to the biased placement of the spring within the plunger chamber, which imposes a biasing force onto the plunger that produces a sufficient degree of plunger to barrel wall area interaction that provides a desired degree of both plunger to barrel electrical continuity and plunger alignment/tip pointing accuracy.

Referring to FIG. 3, a second embodiment of a telescoping spring probe 60, constructed according to principles of this invention, includes an elongated barrel 62 having a generally hollow cylindrical body 64 with a passageway 66 extending from a closed barrel end 68 to a open barrel end 70. The barrel body 64 has a uniform diameter and a uniform wall thickness throughout. In an example of the second embodiment, the barrel body 64 has an axial length of approximately 2.5 mm, an outside diameter of 2 mm, and a wall thickness of approximately 0.1 mm.

An elongated plunger 72 axially disposed within the barrel passageway 66 has a generally cylindrical body 74 with a hollow cavity 76 extending from an open plunger end 78 to a closed plunger end 80. The plunger body 74 has an enlarged diameter section 82 extending axially from the plunger open end 78 to about a midpoint of the plunger. The extended diameter section 82 has an outside diameter smaller than an inside diameter of the barrel passageway 66 to facilitate axial displacement of the plunger therein. In an example of the second embodiment, the tolerance between the outside surface of the plunger enlarged diameter section 82 and the barrel passageway inside surface is approximately 0.02 mm.

A cone-shaped angular section 84 is disposed circumferentially around the midpoint of the plunger body and extends axially along the plunger body from the enlarged diameter section 82 to a reduced diameter section 86. The cone-shaped section 84 is directed radially inward into the barrel passageway 66 from the enlarged diameter section 82. The reduced diameter section 86 extends from the cone-shaped section 84 to the closed end 80 of the plunger, which defines a tip 88 of the plunger. The plunger body 74 has a uniform wall thickness throughout. The plunger tip 88 has a generally rounded shape.

In an example of the second embodiment, the enlarged diameter section 82 extends axially along the plunger body a distance of approximately 1.3 mm. The cone-shaped section 84 is directed radially inward from the enlarged diameter section at an angle of approximately 45 degrees and has an axial length of approximately 0.18 mm. The reduced diameter section 86 has an axial length of approximately 1 mm, and a diameter of approximately 1.5 mm.

The plunger 72 is disposed axially within the barrel passageway 66 so that plunger open end 78 is facing the closed end 68 of the barrel. A coil spring 90 is axially disposed within the barrel passageway 66 and the plunger chamber 76, so that a first spring end 92 is adjacent the barrel closed end 68, and a second spring end 94 is adjacent the plunger closed end 80. The spring can be the same as that described above for the first embodiment.

Maximum outward axial travel of the plunger 72 from the barrel 62 is prevented by a crimped barrel open end 70. The barrel open end 70 is crimped radially inward into the passageway 66 a distance from the barrel body 64 and at an angle that complements the plunger cone-shaped section 84. Contact between the crimped barrel open end 70 and the plunger cone-shaped section 84 prevents the plunger from exiting the barrel passageway.

In the second embodiment, unlike the first embodiment, the plunger does not include a detent, and a resultant biasing force is not imposed on the spring. Because a biasing force is not imposed on the plunger by the spring, to keep the adjacent plunger and barrel walls in contact, any bias imposed on the plunger is provide by action of the target electrical connection (not shown) against the plunger tip 88. Target electrical connections capable of imposing a desired biasing force onto the plunger include those that are shaped having an angled or non-planar contact pad. For example, a target electrical connection having a contact pad oriented at an angle of approximately 45 degrees with respect to the plunger tip 88 is capable of imposing a sufficient biasing force upon the plunger to provide a desired degree of plunger to barrel wall interaction to ensure that current conducted by the probe passes through the plunger and barrel wall, rather than through the spring.

Although the second telescoping spring probe embodiment does not include a mechanism for biasing the plunger into continuous contact with the barrel, the second embodiment does have the advantages of reduced overall length, without sacrificing tip pointing accuracy, when compared to conventional spring probes.

Referring to FIG. 4, a third embodiment of a telescoping spring probe 100, constructed according to principles of this invention, is generally similar to the second embodiment disclosed above with the exception of the plunger tip shape.

The plunger 102 includes a tip 104 at a closed end 106 constructed with an angled or non-planer surface. Because the wall thickness of the plunger 102 is uniform, the corresponding inside surface of the closed end 106 of the plunger chamber 108 has the same angled or non-planar surface. In an example of the third embodiment, the tip 104 surface is shaped having a surface angle of approximately 30 degrees.

The angled plunger tip surface imposes a biasing force upon the spring 105 by placement of the second spring end 108 against the plunger closed end surface 106, which in turn imposes a biasing force on the plunger. In FIG. 4, the biasing force imposed upon the plunger by the spring is one acting in a counter-clockwise direction, i.e., forcing the plunger to rotate to the left (with respect to FIG. 4). The biasing force imposed on the plunger is sufficient to cause the plunger and barrel passageway walls to be in continuous contact during axial travel of the plunger within the barrel and during static placement of the plunger in the barrel, thereby allowing current to be conducted by the probe through the plunger and barrel walls.

Although a plunger tip having a particularly shaped surface has been specifically described and illustrated above for the third embodiment, it is to be understood that plunger tip surfaces shaped other than that described and illustrated can be used to produce a desired spring and plunger biasing mechanism.

Figure 5:
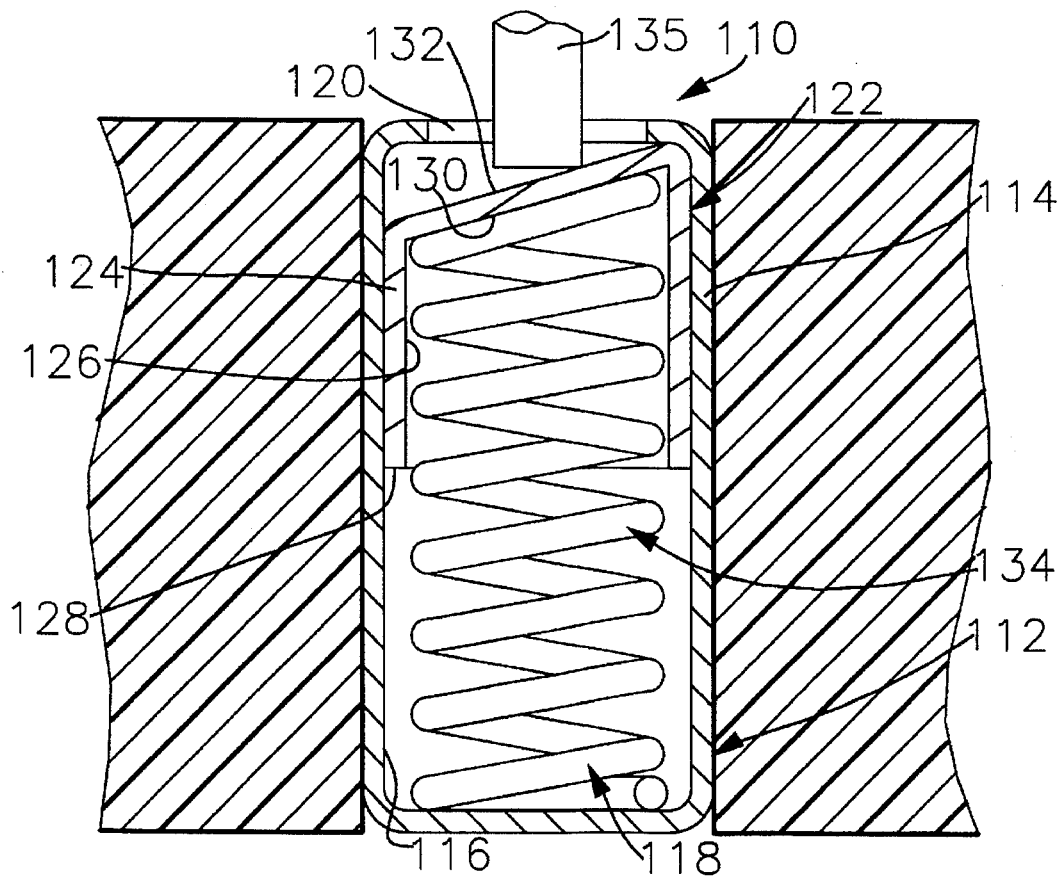
FIG. 5 is a fragmentary cross-sectional side view of an alternate third embodiment of a telescoping spring probe as constructed according to principles of this invention.

Referring to FIG. 5, an alternative third embodiment of the telescoping spring probe 110 has a barrel 112 with a uniform diameter hollow body 114, and a passageway 116 extending from a closed barrel end 118 to an open barrel end 120. The open barrel end 120 is crimped radially inward into the passageway 116.

A plunger 122 disposed axially within the passageway 116 has a hollow body 124 and an internal cavity 126 extending from an open plunger end 128 to a closed plunger end 130. The plunger body has a uniform outside diameter smaller than the barrel passageway to facilitate slidable axial displacement therein. Wall sections of the plunger body have uniform wall thickness. The plunger is disposed within the barrel with its open end 128 facing the closed barrel end 118. In an example of the alternative third embodiment, the tolerance between the plunger body outside diameter and the passageway diameter is approximately 0.02 mm.

The crimped barrel open end 120 has a smaller opening diameter than the outside diameter of the plunger, thereby preventing the plunger from exiting the barrel. Unlike the third telescoping probe embodiment discussed above, the plunger in the alternative third telescoping probe embodiment resides completely within the barrel at all times, i.e., a tip portion of the plunger does not extend outside of the barrel.

A plunger tip 132 is defined by the outside surface of the closed plunger end 130 and is shaped having an angled or beveled profile, in which the plunger end extends at an angle with respect to a plane perpendicular to the axis of the plunger/barrel. A spring 134 is axially disposed in the barrel passageway 116 and in the plunger cavity 126 which has an inside surface at the closed plunger end 130 shaped the same as the plunger tip 132. The spring 134 is placed between the closed plunger end 130 and the closed barrel end 118. As with the third embodiment discussed above, spring action of the spring 134 against the beveled surface of the closed plunger end 130 imposes a force against the plunger that bias as a sidewall portion of the plunger against the adjacent barrel passageway wall to enhance electrical contact between the plunger and barrel. Action of an external electrical contact 135 having a planar surface (perpendicular to the plunger axis) against the beveled plunger tip also contributes to produce the desired biasing force.

The alternative third telescoping spring probe embodiment is placed into operation by inserting a male external electrical contact 135 into the barrel opening 120 so that it makes contact with the tip 132 of the plunger 122. Continued pressing of the electrical contact into the barrel causes the plunger to retract axially inwardly within the barrel against pressure exerted by the spring, which biases the plunger sidewall against the barrel passageway wall.

Applications that favor use of the alternative third telescoping spring probe embodiment include those where a flush fitting probe is desired, so that the barrel is disposed within an opening in an electrically conductive member with the open barrel end 120 placed flush with the conductive member surface. For example, the barrel can be mounted within a plated or otherwise electrically conductive opening in a printed circuit board, loaded board, a plastic connection header or the like.

Figure 6A:
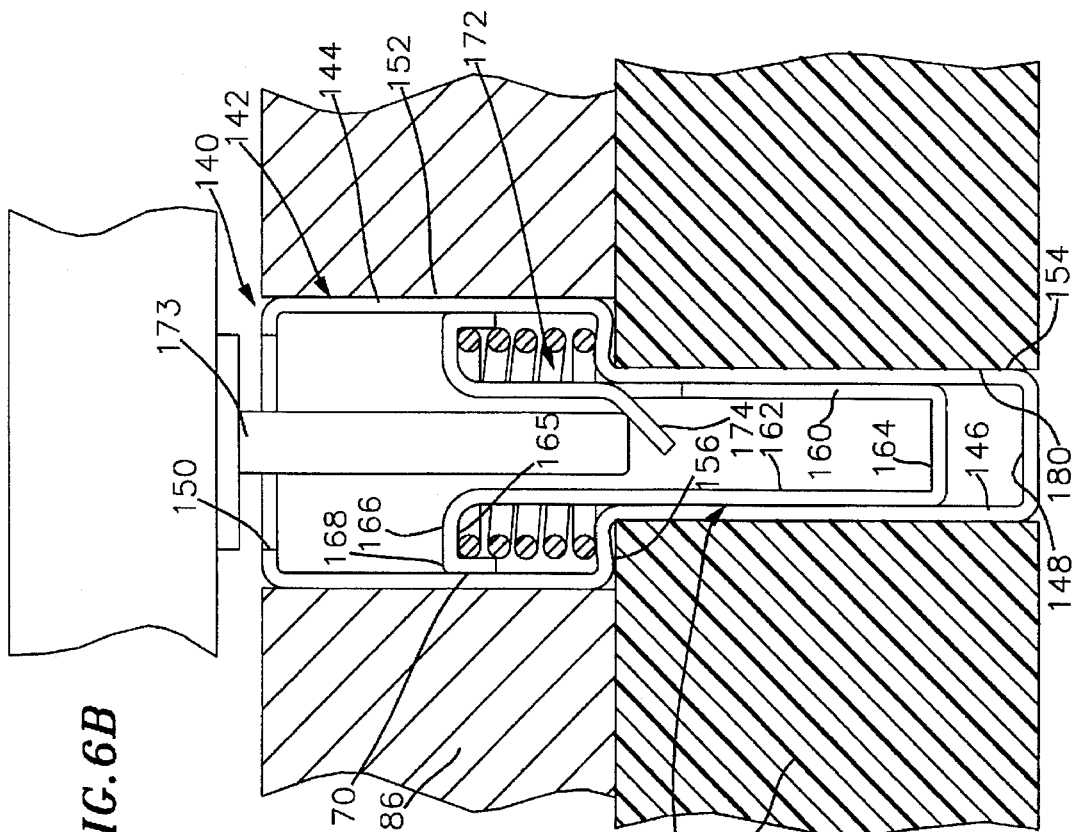
FIG. 6A is a fragmentary cross-sectional side view of a fourth embodiment of a telescoping spring probe as constructed according to principles of this invention, in a resting position.
Figure 6B:
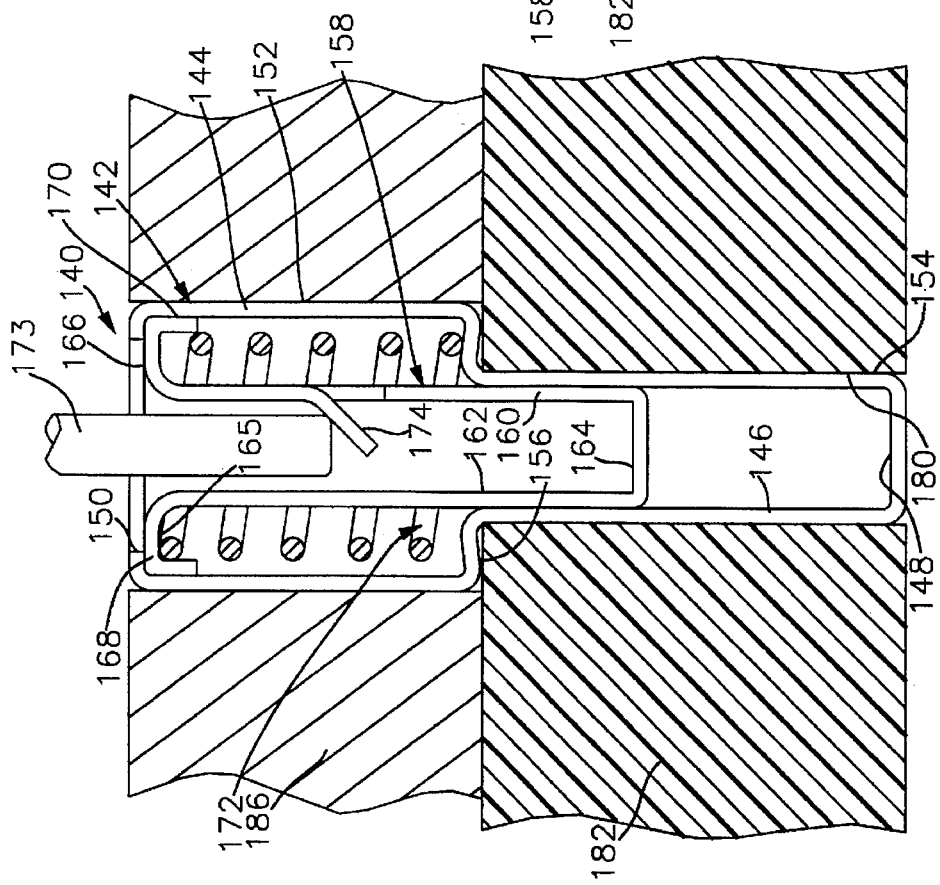
FIG. 6B is a fragmentary cross-sectional side view of a fourth embodiment of a telescoping spring probe as constructed according to principles of this invention, in a retracted position.

Referring to FIGS. 6A and 6B, a fourth embodiment of a telescoping spring probe 140, constructed according to principles of this invention, comprises an elongated barrel 142 having a hollow cylindrical body 144 with a passageway 146 extending from a closed barrel end 148 to an open barrel end 150. The barrel body 144 includes an enlarged diameter section 152 extending axially from the open barrel end 150 toward the closed barrel end 148.

The barrel body 144 includes a reduced diameter section 154 extending axially from the closed barrel end 148 toward the open barrel end 150. A shoulder 156 extends radially inward along the barrel body from the enlarged diameter section 152 to the reduced diameter section 154. The shoulder 156 has a cross-sectional profile that curves downwardly a slight amount, moving radially from the reduced diameter section 154 to the enlarged diameter section 152.

A plunger 158 disposed axially within the barrel passageway 146 has a hollow body 160 with an internal cavity 162 extending from a closed plunger end 164 to an open plunger end 166. The plunger is disposed within the barrel passageway 146 with the closed plunger end 164 facing the closed barrel end 148. The plunger body 160 has a uniform wall thickness and has a uniform outside diameter smaller than the inside diameter of the barrel reduced diameter section 154 to facilitate slidable axial placement therein.

The plunger body 160 has an axial length slightly shorter than the axial length of the barrel reduced diameter section, to provide a sufficient amount of plunger wall to passageway contact to promote continuous electrical continuity therebetween, and to promote a desired degree of plunger alignment and guidance within the passageway.

The open plunger end 166 includes a flared portion 168 extending radially outwardly away from the plunger body. The flared portion 168 includes a terminal edge 170 that is rounded axially downward toward the closed plunger end 164 defining a concave backside surface 165 of the flared portion. The terminal edge 170 has a larger diameter than the barrel reduced diameter section 154 but smaller than the barrel enlarged diameter section 152. This facilitates slidable axial displacement of the plunger in the barrel. The open barrel end 150 is crimped radially inward and has an opening diameter smaller than the terminal edge 170 to prevent the plunger from exiting the barrel passageway.

A spring 172 is disposed axially within the barrel passageway in the enlarged diameter section 152. The spring 172 is placed between the curved portion of the shoulder 156, and the concave backside surface 165 of the plunger end. The spring 172 is disposed around the outside surface of the plunger body and acts to bias the plunger outwardly toward the crimped open barrel end 150, causing the flared portion 168 of the open plunger end 166 to contact the crimped open barrel end 150.

The plunger body 160 includes a means for imposing a biasing force onto the plunger through contact of the plunger with an external male-type electrical connector 173, such as a semiconductor chip standoff and the like. As with the previously discussed telescoping spring probe embodiments, such plunger biasing is desired to provide continuous plunger to barrel passageway wall contact to enhance electrical conductivity.

In an example of the fourth embodiment, a biasing means is in the form of a deflected sidewall portion of the plunger or detent 174 that extends radially inward into the plunger cavity 162. In a preferred fourth embodiment, the detent 174 is a cut-out portion of the plunger side wall positioned axially near a midpoint of the plunger and directed downwardly toward the closed plunger end 164 at an angle from the plunger body 160. The preferred angle is approximately 45 degrees.

Referring to FIG. 6B, contact with the detent 174 by an external electrical connector 173 imposes a sufficient loading force or moment onto the plunger that biases a sidewall portion of the plunger against the barrel passageway. The biasing force from the plunger is directed in a clockwise direction, causing a plunger body sidewall portion adjacent the closed plunger end 164 to be biased to the left against the reduced 154 diameter of the barrel passageway, and causing the open plunger end terminal edge 170 to be biased to the right against the enlarged diameter 152 of the barrel passageway.

The fourth telescoping spring probe embodiment can be used in applications where a flush mounted electrical spring probe is desired, i.e., where the open barrel end is installed planar with the surface of an electrical mounting object, and where reduced signal transfer time is desired. Reduced signal transfer time from the external electrical connector to the electrical mounting object, e.g., a plated lead hole 180 in a printed circuit board 182 (PCB), is achieved by the close spatial placement of the external electrical connection 173 within the plunger by the lead hole 180 when the plunger is in the retracted position, as shown in FIG. 6B. The close spatial placement of the external electrical connection 173 with the lead hole 180 provides a shortened electrically conductive path between the plunger body 160 and reduced diameter section 154 of the barrel, reducing the resistance and capacitance across the conductive path, thereby reducing the time associated with signal transfer therethrough.

The fourth telescoping spring probe embodiment can also be used in applications where an electrically nonconductive insulating material 186 is disposed on a surface of a PCB 182. In this application, the reduced diameter section 154 of the barrel is disposed within a plated or otherwise conductive hole 180 in the PCB, and the enlarged diameter section 152 of the barrel is disposed within an opening in the insulating material 186 with the open barrel end 150 flush with the insulating material surface.

In an example of the fourth telescoping spring probe embodiment, the reduced diameter section 154 has an axial length of approximately 3.4 mm, and has an inside diameter of approximately 0.9 mm. The enlarged diameter section 152 has an axial length of approximately 2.3 mm and has an inside diameter of approximately 1.9 mm. The shoulder 156 extends radially a distance of approximately 0.4 mm outwardly from the reduced diameter section 154 to the enlarged diameter section 152. The crimped open barrel end 150 has an opening diameter of approximately 1.7 mm. The plunger body 160 has an axial length of approximately 3.8 mm, and has an outside diameter of approximately 0.9 mm. The detent 174 is positioned axially away from the open plunger end 166 approximately 1.6 mm. As with the previously discussed telescoping spring probe embodiments, the tolerance between the plunger and the barrel wall is approximately 0.02 mm.

The materials used to constructed the barrel and plunger of each of the embodiments discussed above are selected from the group of conventional electrically conductive probe materials such as copper, brass, gold, and metal alloys such as beryllium-copper, nickel-gold and the like.

Although particular embodiments of telescoping spring probes constructed according to principles of this invention have been specifically described and illustrated, it is to be understood that variations or alternative embodiments of telescoping spring probes apparent to those skilled in the art are within the scope of this invention. Since many such variations may be made, it is to be understood that within the scope of the following claims, this invention may be practiced otherwise than specifically described.

What is claimed is:

1. An electrical contact spring probe comprising:
   a barrel having a hollow body with a passageway extending from a closed barrel end to a open barrel end, wherein the open barrel end is crimped radially inward;
   a plunger axially disposed within the barrel passageway, wherein the plunger has a hollow body with a cavity extending from an open plunger end to a closed plunger end, wherein the open plunger end is oriented within the barrel passageway facing the closed barrel end, and wherein the plunger body has an outside surface portion with a diameter greater than the crimped barrel open end to prevent the plunger from exiting the barrel;
   a spring disposed axially within the barrel passageway and the plunger cavity, wherein the closed plunger end has a tip that extends outwardly from the barrel passageway, and wherein the spring is positioned, in the cavity between the barrel closed end the plunger closed end; and
   means disposed within the plunger cavity for imposing a sufficient radially directed force onto the spring to bias a sidewall portion of the plunger body against the barrel passageway for enhancing mechanical contact therebetween during axial travel of the plunger in the barrel against the bias of the spring, said enhanced mechanical contact producing continuity of electrical conduction between the plunger and barrel during said axial travel.

2. An electrical contact spring probe as recited in claim 1 wherein the means for imposing a force onto the spring comprises a closed plunger end having an angled profile, wherein action of a spring end against the angled closed plunger end imposes a force onto the plunger that causes the plunger body to be biased against the barrel passageway.

3. An electrical contact spring probe as recited in claim 1 wherein the plunger body has a enlarged diameter section and a reduced diameter section, wherein the enlarged diameter section has an outside diameter smaller than an inside diameter of the barrel passageway, and wherein the reduced diameter section has an outside diameter smaller than the crimped barrel open end.

4. An electrical contact spring probe as recited in claim 1 wherein maximum axial displacement of the plunger within the barrel passageway is defined by contact between the plunger open end and the barrel closed end.

5. An electrical contact spring probe comprising:
   a barrel having a hollow body with a passageway extending from a closed barrel end to a open barrel end, wherein the open barrel end is crimped radially inward;
   a plunger axially disposed within the barrel passageway, wherein the plunger has a hollow body with a cavity extending from an open plunger end to a closed plunger end, wherein the open plunger end is oriented within the barrel passageway facing the closed barrel end, and wherein the plunger body has an outside surface portion with a diameter greater than the crimped barrel open end to prevent the plunger from exiting the barrel;
   a spring disposed axially within the barrel passageway and the plunger cavity, wherein the closed plunger end has a tip that extends outwardly from the barrel passageway, and wherein the spring is positioned, in the cavity between the barrel closed end the plunger closed end; and
   means disposed within the plunger cavity for imposing a sufficient force onto the spring to bias a sidewall portion of the plunger body against the barrel passageway for enhancing mechanical contact therebetween during axial travel of the plunger in the barrel against the bias of the spring, said enhanced mechanical contact producing continuity of electrical conduction between the plunger and barrel during said axial travel;
   wherein the enlarged diameter section of the plunger body includes a detent directed radially inward into the cavity, wherein the spring is positioned between the barrel closed end and the detent, and wherein action of a spring end against the detent imposes a force onto the plunger that causes the plunger body to be biased against the barrel passageway.

6. An electrical contact spring probe as recited in claim 5 wherein the detent is positioned adjacent the reduced diameter section of the plunger, preventing the spring end from contacting the plunger closed end.

7. An electrical contact spring probe comprising:
   a barrel having a hollow body with a passageway extending from a closed barrel end to a open barrel end, wherein the open barrel end is crimped radially inward into the passageway;
   a plunger axially disposed within the barrel passageway, wherein the plunger has a hollow body with a cavity extending from an open plunger end to a closed plunger end, wherein the open plunger end is oriented within the barrel passageway facing the closed barrel end, and wherein the plunger body includes an outside surface section having a diameter greater than the crimped barrel open end to prevent the plunger from exiting the barrel;
   a spring axially disposed both within the barrel passageway and the plunger cavity; and
   means disposed within the plunger cavity for imposing a sufficient radially directed force onto the spring to bias a sidewall portion of the plunger body against the barrel passageway, comprises a plunger closed end having an angled profile, wherein action of an end of the spring against the plunger closed end causes the spring to impose a sufficient force onto the plunger to bias a sidewall portion of the plunger body against the barrel passageway during axial travel of the plunger with barrel to enhance mechanical contact between the plunger and barrel to thereby enhance electrical continuity between them during said axial travel.

8. An electrical contact spring probe comprising:

a barrel having a hollow body with a passageway extending from a closed barrel end to a open barrel end, wherein the open barrel end is crimped radially inward into the passageway;

a plunger axially disposed within the barrel passageway, wherein the plunger has a hollow body with a cavity extending from an open plunger end to a closed plunger end, wherein the open plunger end is oriented within the barrel passageway facing the closed barrel end, and wherein the plunger body includes an outside surface section having a diameter greater than the crimped barrel open end to prevent the plunger from exiting the barrel;

a spring axially disposed both within the barrel passageway and the plunger cavity;

wherein the plunger body comprises a deflected sidewall portion that is directed radially into the plunger cavity, wherein action of an end of the spring against the deflected sidewall portion causes the spring to impose a sufficient sideways directed force onto the plunger to bias a sidewall portion of the plunger body against the barrel passageway during axial travel of the plunger with barrel to enhance mechanical contact between the plunger and barrel to thereby enhance electrical continuity between them during said axial travel.

9. An electrical contact spring probe as recited in claim 8 wherein the deflected sidewall portion is positioned axially along the plunger body a distance from the plunger closed end so that the spring end does not contact the plunger closed end.

10. An electrical contact spring probe comprising:

a barrel having a hollow body with a passageway extending from a closed barrel end to a open barrel end, wherein the open barrel end is crimped radially inward into the passageway;

a plunger axially disposed within the barrel passageway, wherein the plunger has a hollow body with a cavity extending from an open plunger end to a closed plunger end, wherein the open plunger end is oriented within the barrel passageway facing the closed barrel end, wherein the plunger body includes an outside surface section having a diameter greater than the crimped barrel open end to prevent the plunger from exiting the barrel, and wherein the plunger body includes:

an enlarged diameter section extending axially a distance from the open plunger end;

a reduced diameter section extending axially a distance from the closed plunger end; and a cone-shaped section between the enlarged and reduced sections;

a spring axially disposed both within the barrel passageway and the plunger cavity; and means disposed within the plunger cavity for imposing a sufficient force onto the spring to bias a sidewall portion of the plunger body against the barrel passageway, comprises a plunger closed end having an angled profile, wherein action of an end of the spring against the plunger closed end causes the spring to impose a sufficient force onto the plunger to bias a sidewall portion of the plunger body against the barrel passageway during axial travel of the plunger with barrel to enhance mechanical contact between the plunger and barrel to thereby enhance electrical continuity between them during said axial travel.

11. An electrical contact spring probe as recited in claim 10 wherein the enlarged diameter section has an outside diameter smaller than an inside diameter of the barrel passageway, and wherein the enlarged diameter section is completely disposed within the barrel passageway.

12. An electrical contact spring probe as recited in claim 11 wherein a tolerance between the enlarged diameter plunger section and the barrel passageway is approximately 0.02 millimeter.

13. An electrical contact spring probe as recited in claim 10 wherein the reduced diameter section has an outside diameter smaller than the crimped barrel open end, and wherein the reduced diameter section is completely outside of the barrel passageway when the plunger is in a nonretracted position.

14. An electrical contact spring probe as recited in claim 10 wherein action of the crimped barrel open end against the cone-shaped section of the plunger body prevents the plunger from completely exiting the barrel passageway.

15. An electrical contact spring probe comprising:

a barrel having a hollow body and an internal passageway extending therethrough from a barrel closed end to a barrel open end, wherein the barrel open end is crimped radially inwardly into the passageway;

a plunger axially disposed within the passageway, the plunger having a hollow body and an internal cavity extending therethrough from a plunger closed end to a plunger open end, wherein the plunger body is oriented within the passageway with the plunger closed end facing the barrel closed end, and wherein the plunger open end includes a radial portion having an outside diameter larger than the crimped barrel open end to prevent the plunger from exiting the passageway;

a spring disposed axially within a portion of the passageway and around an exterior portion of the plunger body confined within the barrel;

means disposed within the plunger cavity extending from a wall surface for imposing a radially directed force to the plunger when an external connector is placed within the plunger cavity, the sideways force causing a sidewall portion of the plunger body to be biased against the barrel passageway to maximize electrical contact therebetween;

wherein the barrel body include an enlarged diameter section extending axially a distance from the barrel open end, the spring confined in this section of the barrel, and a reduced diameter plunger guide section extending axially from the barrel closed end; and wherein the plunger body has a uniform outside diameter portion smaller than the passageway in the barrel and disposed within the plunger guide section of the barrel to facilitate slidable axial displacement of the plunger in the barrel against the bias of the spring.

16. An electrical contact spring probe comprising:

a barrel having a hollow body with a passageway extending therethrough from a closed barrel end to a open barrel end, wherein the open barrel end is crimped radially inward into the passageway;

a plunger axially disposed within the barrel passageway, wherein the plunger has a hollow body with an internal cavity extending therethrough from an open plunger end to a closed plunger end, wherein the open plunger end is oriented within the barrel passageway facing the closed barrel end, and wherein the plunger body includes an outside surface section having a diameter greater than the crimped barrel open end to prevent the plunger from exiting the barrel; and a spring axially disposed both within the barrel passageway and the plunger cavity;

wherein the plunger includes a deflected sidewall portion directed radially inwardly into the cavity, to impose a sufficient force onto the spring to bias a sidewall portion of the plunger body against the barrel passageway during axial travel of the plunger in the barrel.

17. An electrical contact spring probe as recited in claim 16 wherein the spring is disposed within the passageway and the internal cavity with a first spring end placed adjacent the closed barrel end and a second spring end placed adjacent the deflected plunger sidewall portion.

18. An electrical contact spring probe as recited in claim 16 wherein a tolerance between the enlarged diameter plunger section and the barrel passageway is approximately 0.02 millimeter.

19. An electrical contact spring probe as recited in claim 16 wherein the spring is disposed completely within the internal chamber defined by the enlarged diameter section of the plunger body.

* * * * *